(12) United States Patent
Jiang et al.

(10) Patent No.: US 9,287,419 B2
(45) Date of Patent: *Mar. 15, 2016

(54) WAVELENGTH CONVERSION PERYLENE DIESTER CHROMOPHORES AND LUMINESCENT FILMS

(75) Inventors: Zongcheng Jiang, Oceanside, CA (US); Bogumila Rachwal, Oceanside, CA (US); Hongxi Zhang, Tucson, AZ (US); Peng Wang, San Diego, CA (US); Michiharu Yamamoto, Carlsbad, CA (US); Shuangxi Wang, Corona, CA (US)

(73) Assignee: Nitto Denko Corporation, Osaka (JP)

( * ) Notice: Subject to any disclaimer, the term of this patent is extended or adjusted under 35 U.S.C. 154(b) by 248 days.

This patent is subject to a terminal disclaimer.

(21) Appl. No.: 13/978,370

(22) PCT Filed: Jan. 4, 2012

(86) PCT No.: PCT/US2012/020209
§ 371 (c)(1),
(2), (4) Date: Jul. 3, 2013

(87) PCT Pub. No.: WO2012/094409
PCT Pub. Date: Jul. 12, 2012

(65) Prior Publication Data
US 2013/0284265 A1      Oct. 31, 2013

Related U.S. Application Data

(60) Provisional application No. 61/430,053, filed on Jan. 5, 2011, provisional application No. 61/485,093, filed on May 11, 2011.

(51) Int. Cl.
*H01L 51/00* (2006.01)
*H01L 31/0216* (2014.01)
(Continued)

(52) U.S. Cl.
CPC ............ *H01L 31/02168* (2013.01); *C09B 3/14* (2013.01); *C09K 11/06* (2013.01); *H01L 51/0055* (2013.01); *C09K 2211/1011* (2013.01); *Y02E 10/52* (2013.01)

(58) Field of Classification Search
CPC .. C09B 3/14; C09K 11/06; C09K 2211/1011; H01L 51/0055; H01L 31/02168; Y02E 10/52
USPC .......................................................... 136/263
See application file for complete search history.

(56) References Cited

U.S. PATENT DOCUMENTS

| | | |
|---|---|---|
| 3,239,406 A | 3/1966 | Coffman et al. |
| 4,162,928 A | 7/1979 | Frosch et al. |

(Continued)

FOREIGN PATENT DOCUMENTS

| | | |
|---|---|---|
| CN | 1 473 187 | 2/2004 |
| CN | 1 671 675 | 9/2005 |

(Continued)

OTHER PUBLICATIONS

Currie et al., "High-Efficiency Organic Solar Concentrators for Photovoltaics", Science, 2008, vol. 321, pp. 226.

(Continued)

*Primary Examiner* — Devina Pillay
(74) *Attorney, Agent, or Firm* — Vedder Price P.C.

(57) ABSTRACT

This invention is related to novel perylene diester derivatives represented by the general formula (I) or general formula (II) as described herein. The derivatives are useful in various applications, such as luminescent dyes for optical light collection systems, fluorescence-based solar collectors, fluorescence-activated displays, and/or single-molecule spectroscopy. The invention also relates to a luminescent medium, such as a luminescent film, that can significantly enhance the solar harvesting efficiency of thin film CdS/CdTe or CIGS solar cells. The luminescent medium comprises an optically transparent polymer matrix and at least one luminescent dye that comprises a perylene diester derivative. Over 16% of an efficiency enhancement to a CdS/CdTe solar cell and over 12% of an efficiency enhancement to a CIGS solar cell can be achieved.

20 Claims, 1 Drawing Sheet

(51) Int. Cl.
*C09B 3/14* (2006.01)
*C09K 11/06* (2006.01)

(56) References Cited

U.S. PATENT DOCUMENTS

| | | | |
|---|---|---|---|
| 4,262,851 A | 4/1981 | Graser et al. |
| 4,379,934 A | 4/1983 | Graser et al. |
| 4,419,427 A | 12/1983 | Graser et al. |
| 4,431,808 A | 2/1984 | Protiva et al. |
| 4,446,324 A | 5/1984 | Graser |
| 4,450,273 A | 5/1984 | Graser |
| 4,501,906 A | 2/1985 | Spietschka et al. |
| 4,594,420 A | 6/1986 | Spietschka et al. |
| 4,618,694 A | 10/1986 | Iden et al. |
| 4,667,036 A | 5/1987 | Iden et al. |
| 4,709,029 A | 11/1987 | Spietschka et al. |
| 4,725,690 A | 2/1988 | Graser |
| 4,746,741 A | 5/1988 | Staudenmayer et al. |
| 4,831,140 A | 5/1989 | Spietschka et al. |
| 4,845,223 A | 7/1989 | Seybold et al. |
| 4,968,571 A | 11/1990 | Gruenbaum et al. |
| 5,019,473 A | 5/1991 | Nguyen et al. |
| 5,028,504 A | 7/1991 | Rule et al. |
| 5,077,161 A | 12/1991 | Law |
| 5,123,966 A | 6/1992 | Dietz et al. |
| 5,141,837 A | 8/1992 | Nguyen et al. |
| 5,154,770 A | 10/1992 | Spietschka et al. |
| 5,248,774 A | 9/1993 | Dietz et al. |
| 5,264,034 A | 11/1993 | Dietz et al. |
| 5,466,807 A | 11/1995 | Dietz et al. |
| 5,472,494 A | 12/1995 | Hetzenegger et al. |
| 5,645,965 A | 7/1997 | Duff et al. |
| 5,693,808 A | 12/1997 | Langhals |
| 5,710,197 A | 1/1998 | Fischer et al. |
| 5,808,073 A | 9/1998 | Böhm et al. |
| 5,816,238 A | 10/1998 | Burns et al. |
| 5,874,580 A | 2/1999 | Hao et al. |
| 5,981,773 A | 11/1999 | Langhals et al. |
| 6,063,181 A | 5/2000 | Bohm et al. |
| 6,136,976 A | 10/2000 | Böehm et al. |
| 6,139,210 A | 10/2000 | Nelson et al. |
| 6,166,210 A | 12/2000 | Langhals et al. |
| 6,184,378 B1 | 2/2001 | Böhm et al. |
| 6,326,494 B1 | 12/2001 | Böhm et al. |
| 6,572,977 B1 | 6/2003 | Pavelka et al. |
| 6,654,161 B2 | 11/2003 | Bass et al. |
| 6,806,368 B2 | 10/2004 | Wurthner et al. |
| 6,924,427 B2 | 8/2005 | Eckert et al. |
| 6,986,811 B2 | 1/2006 | Könemann et al. |
| 7,714,099 B2 | 5/2010 | Morishita et al. |
| 7,791,157 B2 | 9/2010 | Cho et al. |
| 7,867,601 B2 | 1/2011 | Ikishima et al. |
| 7,887,914 B2 | 2/2011 | Kobayashi et al. |
| 7,943,845 B2 | 5/2011 | Hayes |
| 8,158,450 B1 | 4/2012 | Sheats et al. |
| 2004/0092246 A1 | 5/2004 | Cai et al. |
| 2004/0115473 A1 | 6/2004 | Burroughes et al. |
| 2006/0041221 A1 | 2/2006 | Stypulkowski |
| 2006/0052612 A1 | 3/2006 | Stossel et al. |
| 2006/0083945 A1 | 4/2006 | Morishita et al. |
| 2007/0003783 A1 | 1/2007 | Morishita et al. |
| 2007/0073052 A1 | 3/2007 | Velusamy et al. |
| 2008/0087878 A1 | 4/2008 | Koenemann et al. |
| 2008/0114170 A1 | 5/2008 | Konemann et al. |
| 2008/0149165 A1 | 6/2008 | Hoeks et al. |
| 2008/0236667 A1 | 10/2008 | Naum et al. |
| 2008/0245411 A1 | 10/2008 | Hammermann et al. |
| 2008/0289681 A1 | 11/2008 | Adriani et al. |
| 2009/0151785 A1 | 6/2009 | Naum et al. |
| 2010/0012183 A1 | 1/2010 | Yeh |
| 2010/0043875 A1 | 2/2010 | Bhaumik et al. |
| 2010/0139769 A1 | 6/2010 | Mapel |
| 2010/0154862 A1 | 6/2010 | Schiavoni et al. |
| 2010/0186801 A1 | 7/2010 | Boehm et al. |
| 2010/0224248 A1 | 9/2010 | Kenney et al. |
| 2010/0249367 A1 | 9/2010 | Toppare et al. |
| 2010/0278480 A1 | 11/2010 | Vasylyev |
| 2010/0294339 A1 | 11/2010 | Hollars |
| 2011/0011455 A1 | 1/2011 | Ji et al. |
| 2011/0204292 A1 | 8/2011 | Imamura |
| 2011/0253197 A1 | 10/2011 | Mapel et al. |
| 2012/0222723 A1 | 9/2012 | Mayer et al. |
| 2012/0227809 A1 | 9/2012 | Bharti et al. |
| 2013/0074927 A1 | 3/2013 | Rachwal et al. |
| 2013/0089946 A1 | 4/2013 | Zhang et al. |
| 2013/0139868 A1 | 6/2013 | Zhang et al. |
| 2013/0284265 A1 | 10/2013 | Jiang et al. |
| 2014/0083482 A1 | 3/2014 | Hebrink |
| 2014/0311566 A1 | 10/2014 | Zhang et al. |
| 2015/0041042 A1 | 2/2015 | Zhang et al. |
| 2015/0041052 A1 | 2/2015 | Zhang et al. |

FOREIGN PATENT DOCUMENTS

| | | | |
|---|---|---|---|
| CN | 101 148 495 | 3/2008 |
| CN | 101 289 447 | 10/2008 |
| CN | 101 343 352 | 1/2009 |
| CN | 101 671 428 | 3/2010 |
| CN | 101 768 138 | 7/2010 |
| CN | 101 775 123 | 7/2010 |
| CN | 101 935 389 | 1/2011 |
| CN | 102 464 794 | 5/2012 |
| DE | 28 51 513 | 6/1980 |
| DE | 34 00 991 | 7/1985 |
| DE | 10 2005 062 687 | 7/2007 |
| EP | 0 692 517 | 1/1996 |
| EP | 2 194 106 | 6/2010 |
| EP | 2 080 785 | 12/2010 |
| EP | 2 261 300 | 12/2010 |
| EP | 2 333 017 | 6/2011 |
| EP | 2 354 204 | 8/2011 |
| EP | 2 355 162 | 8/2011 |
| EP | 2 557 137 | 2/2013 |
| EP | 2 557 606 | 2/2013 |
| EP | 2 578 075 | 4/2013 |
| JP | 05-255663 | 10/1993 |
| JP | 11-220147 | 8/1999 |
| JP | 2001-000410 | 1/2001 |
| JP | 2001-094129 | 4/2001 |
| JP | 2005-258388 | 9/2005 |
| JP | 2006-077171 | 3/2006 |
| JP | 2008-516008 | 5/2008 |
| JP | 2010-283282 | 12/2010 |
| JP | 2011-151094 | 8/2011 |
| JP | 2012-077116 | 4/2012 |
| WO | WO 02/22761 | 3/2002 |
| WO | WO 2004/092246 | 10/2004 |
| WO | WO 2005/054212 | 6/2005 |
| WO | WO 2006/041221 | 4/2006 |
| WO | WO 2006/088369 | 8/2006 |
| WO | WO 2008/110567 | 9/2008 |
| WO | WO 2009/011791 | 1/2009 |
| WO | WO 2009/115574 | 9/2009 |
| WO | WO 2010/046114 | 4/2010 |
| WO | WO 2010/114497 | 10/2010 |
| WO | WO2010/118920 A1 * | 10/2010 | ............ C08F 120/18 |
| WO | WO 2011/068305 | 6/2011 |
| WO | WO 2011/072876 | 6/2011 |
| WO | WO 2012/0094409 | 1/2012 |
| WO | WO 2012/024070 | 2/2012 |
| WO | WO 2012/043401 | 4/2012 |
| WO | WO 2012/068703 | 5/2012 |
| WO | WO 2012/094409 | 7/2012 |
| WO | WO 2012/134992 | 10/2012 |
| WO | WO 2013/049062 | 4/2013 |
| WO | WO 2013/052381 | 4/2013 |
| WO | WO 2013/067288 | 5/2013 |
| WO | WO 2013/085607 | 6/2013 |
| WO | WO 2013/116559 | 8/2013 |
| WO | WO 2014/116569 | 8/2013 |

(56) References Cited

FOREIGN PATENT DOCUMENTS

| WO | WO 2014/160707 | 10/2014 |
|---|---|---|
| WO | WO 2014/197393 | 12/2014 |

OTHER PUBLICATIONS

Glaeser et al., "Improvement of Photon Collection in Cu(in,Ga)Se2 Solar Cells and Modules by Fluorescent Frequency Conversion", Thin Solid Films, 2007, vol. 515, pp. 5964-5967.
Hong et al., "Organic dye-doped thin films for wavelength conversion and their effects on photovoltaic characteristics of CdS/CdTe solar cell", Japan Journal of Applied Physics, 2004, vol. 43, pp. 1421-1426.
Jones et al., "Tuning Orbital Energetics in Arylene Diimide Semiconductors. Materials Design for Ambient Stability of n-Type Charge Transport", Journal of American Chemical Society, 2007, vol. 129, pp. 15259-15278.
Klampaftis et al., "Enhancing the Performance of Solar Cells via Luminescent Down-Shifing of the Incident Spectrum: A Review", Materials and Solar Cells, 2009, vol. 93, pp. 1182-1194.
Lin et al., "High Photoelectric Conversion Efficiency of Metal Phthalocyanine/Fullerene Heterojunction Photovoltaic Device", International Journal of Molecular Sciences, 2011, vol. 12, pp. 476-505.
Maruyama et al., "Transformations of the Wavelength of the Light Incident Upon Solar Cells", Solar Energy Materials and Solar Cells, 2001, vol. 69, pp. 207.
Muffler et al., "Colloid Attachment by ILGAR-layers: Creating Fluorescing Layers to Increase Quantum Efficiency of Solar Cells", Solar Energy Materials and Solar Cells, 2006, vol. 90, pp. 3143-3150.
Richards et al., "Overcoming the Poor Short Wavelength Spectral Response of CdS/CdTe Photovoltaic Modules via Luminescence Down-Shifting: Ray-Tracing Simulations", Progress in Photovoltaics: Research and Applications, 2007, vol. 15, pp. 27-34.
Yuan et al., "Efficient Synthesis of Regioisomerically Pure Bis(trufluoronnethyl)-Substituted 3,4,9,10-Perylene Tetacarboxylic Bis(Benzimidazole)", Organic Letters, 2009, vol. 11, No. 13, pp. 2808-2811.
Zhang et al., "Synthesis and Characterization of Perylene Tetracarboxylic Bisester Monoimide Derivatives", Dyes and Pigments Journal, 2008, vol. 76, pp. 810-816.
International Search Report and Written Opinion in PCT Application No. PCT/US2012/020209, dated Jul. 17, 2012.
Balan et al., "One Polymer for All: Benzotriazole Containing Donor-Acceptor Type Polymer as a Multi-Purpose Material," Chemical Communications, 2009, vol. 44, pp. 6768-6770.
Baran et al., "Processable Multipurpose Conjugated Polymer for Electrochromic and Photovoltaic Applications," Chemistry of Materials, 2010, vol. 22, pp. 2978-2987.
çetin et al., "A New p- and n-Dopable Selenophene Derivative and its Electrochromic Properties," Organic Electronics, Feb. 2009, vol. 10, No. 1, pp. 34-41.
Falzon et al., "Designing Acceptor Polymers for Organic Photovoltaic Devices," The Journal of Physical Chemistry, 2011, vol. 115, No. 7, pp. 3178-3187
Hasboe et al., "Hierarchical Assembly of Porphyrins and Fullerenes for Solar Cells," The Electrochemical Society Interface, Summer 2006, pp. 47-51.
Içli et al., "Donor-Acceptor Polymer Electrochromes with Tunable Colors and Performance," Chemistry of Materials, 2010, vol. 22, No. 13, pp. 4034-4044.
Ishi-i et al., "Fluorescent Two-photon Absorption Benzothiadiazole Dyes Having Photoreleasing Quenchers," Chemistry Letters, 2009, vol. 38, No. 11, pp. 1042-1043.
Min et al., "Synthesis and Photovoltaic Properties of D-A Copolymers Based on Dithienosilole and Benzotriazole," Macromolecules, 2011, vol. 44, No. 19, pp. 7632-7638.
Pasker et al., "Thiophene-2-aryl-2H-benzotriazole,thiophene Oligomers with Adjustable Electronic Properties," Organic Letters, 2011, vol. 13, No. 9, pp. 2338-2341.

Peng et al., "A New Dithienylbenzotriazole-Based Poly(2,7-carbazole) for Efficient Photovoltaics," Macromolecular Chemistry and Physics, 2010, vol. 211, No. 18, pp. 2026-2033.
Shigeiwa et al., "Two-Photon Absorption and Fluorescene Properties of Benzothiadiazole Dyes," Nonlinear Optics, Quantum Optics, 2005, vol. 34, No. 1-4, pp. 171-174.
Singh-Rachford et al., "Photon Upconversion Based on Sensitized Triplet-triplet Annihilation," Coord, Chem. Rev. 254 (2010) pp. 2560-2573.
Tamimoto et al., "Synthesis of n-Type Poly(benzotriazole)s having p-Conducting and Polymerizable Carbazole Pendants," Macromolecules 2006, 39: pp. 3546-3552.
Velusamy et al., "Benzo[1,2,5]Selenadiazole Bridged Amines: Electro-Optical Properties," Tetrahedron Letters, Oct. 2005, vol. 46, No. 44, pp. 7647-7651.
Velusamy et al., "Organic Dyes Incorporating Low-Band-Gap Chromophores for Dye-Sensitized Solar Cells," Organic Letters, 2005, vol. 7, No. 10, pp. 1899-1902.
Xu et al., "Conjugated Polymers for Optoelectronic Applications," Macromolecular Symposia, 2008, pp. 161-170.
Yigitsoy et al., "Multichromic Polymers of Benzotriazole Derivates: Effect of Benzul Substitution," Electrochimica Acta, 2011, vol. 56, No. 5, pp. 2263-2268.
Zhang et al., "Copolymers from Benzodithiphene and Benzotriazole: Synthesis and Photovoltaic Applications," Polymer Chemistry, 2010, vol. 1, No. 9, pp. 1441-1447.
Zhang et al., "Synthesis and Photovoltaic Properties of Dithienyl Benzotriazole Based Poly(phenylene vinylene)s," Journal of Applied Science, 2011, vol. 120, pp. 2534-2542.
Zhu et al., "Organic D-A-π-A Solar Cell Sensitizers with Improved Stability and Spectral Response," Advanced Functional Materials, 2011, vol. 21, pp. 756-763.
DuPont Teflon Films for Photovoltaic Modules (Dec. 2006).
Tedlar Polyvinyl Fluoride Film, Du Pont —Product and Performance Guide, Dec. 1995, pp. 6.
International Search Report and Written Opinion in PCT Application No. PCT/US2012/057118, dated Apr. 22, 2013, 23 pages.
International Search Report and Written Opinion in PCT Application No. PCT/US2012/058062, dated Jun. 12, 2013, 22 pages.
International Preliminiary Report on Patentability and Written Opinion in PCT Application No. PCT/US2012/058062, dated Apr. 8, 2014, 13 pages.
International Search Report and Written Opinion in PCT Application No. PCT/US2013/024225, dated May 7, 2013, 12 pages.
International Search Report and Written Opinion in PCT Application No. PCT/US2013/024212, dated Apr. 23, 2013 , 15 pages.
International Search Report and Written Opinion in PCT Application No. PCT/US2012/053218, dated Apr. 22, 2013, 16 pages.
First Office Action and English Translation in corresponding Chinese Appl. No. 201280001373.X mailed on Jul. 17, 2014, 32 pages.
Second Office Action and English Translation in corresponding Chinese Appl. No. 201280001373.X mailed on May 20, 2015, 22 pages.
First Office Action and English Translation in corresponding Chinese Appl. No. 201280001371.0 mailed on Feb. 4, 2015, 23 pages.
First Office Action in corresponding U.S. Appl. No. 13/626,679 mailed on Apr. 14, 2015, 25 pages.
Indian Journal of Pure and Applied Physics, vol. 33, pp. 169-178, (1995).
Akbaşoğlu et al., "Electrochemical and Optical Studies of Furan and Thieno[3,2-B]Thiophene End Capped Benzotriazole Derivatives," Journal of Polymer Science Part A: Polymer Chemistry, Dec. 1, 2010, vol. 48, No. 23, pp. 5603-5610.
Balan et al., "Donor-Acceptor Polymer with Benzotriazole Moiety: Enhancing the Electrochomic Properties of the 'Donor Unit,'" Chemistry of Materials, 2008, vol. 20, No. 24, pp. 7510-7513.
Balan et al., "Electrochromic Device and Bulk Heterojunction Solar Cell Applications of Poly 4,7-bis(2,3-dihydrothieno[3,4-b][1,4]dioxin-5-y1)-2-dodecy1-2H-benzo[1,2,3]triazole (PBEBT)," Solar Energy Materials & Solar Cells, 2010, vol. 94, pp. 1797-1802.
Baran et al., "Processable Multipurpose Conjugated Polymer for Electrochromic and Photovoltaic Applications," Chemistry of Materials, 2010, Vol, 22, pp. 2978-2987.

(56) References Cited

OTHER PUBLICATIONS

Baran et al., "Spectroelectrochemical and Photovoltaic Characterization of a Solution-Processable n-and-p Type Dopable Pyrrole-Bearing Conjugated Polymer," Macromolecular Chemistry and Physics, 2010, vol. 211, No. 24, pp. 2602-2610.
Bulut et al., "Benzotriazole Derivatives as Long Wavelength Photosensitizers for Diaryliodonium Salt Initiators," Journal of Polymer Science Part A: Polymer Chemistry, 2010, vol. 39, No. 3, pp. 729-733.
Celebi et al., "Enhancing Electrochromic and Kinetic Properties of poly(2,3-bis(4-tert-butyphenyl)-5,8-di(1H-pyrrol-2-yl) quinoxaline) by Copolymerization," Electrochimica Acta, Feb. 28, 2010, vol. 55, No. 7, pp. 2373-2376.
Cui et al., "Incorporating Benzotriazole Moiety to Construct D-A-π-A Organic Sensitizers for Solar Cells: Significant Enhancement of Open-Circuit Photovoltage with Long Alkyl Group," Chemistry of Materials, 2011, vol. 23, No. 19, pp. 4394-4401.
Ekiz et al., "Electrochemical Polymerization of (2-Dodecyl-4,7-di(thiophen-2-yl)-2H-benzo[d][1,2,3]triazole): A Novel Matrix for Biomolecule Immobilization," Macromolecular Bioscience, Dec. 8, 2010, vol. 10, No. 12, pp. 1557-1565.
Falzon et al., "Designing Acceptor Polymers for Organic Photovoltaic Devices," The Journal of Physical Chemistry, 2011, vol. 115, No. 7, pp. 3178-3187.
Hizalan et al., "Spray Processable Ambipolar Benzotriazole Bearing Electrochromic Polymers with Multi-Colored and Transmissive States," Journal of Materials Chemistry, 2011, vol. 21, No. 6, pp. 1804-1809.
Hu et al., "Theoretical Investigation on the White-Light Emission from a Single-Polymer System with Simultaneous Blue and Orange Emission" Polymer, Nov. 2009, vol. 50, No. 25, pp. 6172-6185.
Hu et al., "Theoretical Investigation on the White-Light Emission from a Single-Polymer System with Simultaneous Blue and Orange Emission (Part II)," European Polymer Journal, Feb. 2011, vol. 47, No. 2, pp. 208-224.
Karakus et al., "Electrochemical and Optical Properties of Solution Processable Benzotriazole and Benzothiadiazole Containing Copolymers," Synthetic Metals, Feb. 2012, vol. 162, No. 1-2, pp. 79-84.
Kato et al., "Novel 2,1,3-Benzothiadiazole-Based Red-Fluorescent Dyes with Enhanced Two-Photon Absorption Cross-Sections," Chemistry—A European Journal, Mar. 1, 2006, vol. 12, No. 8, pp. 2303-2317.
Kato et al., "Strongly red-fluorescent novel donor-π-bridge-acceptor-π-bridgedonor (D-π-A-π-D) type 2,1,3-benzothiadiazoles with enhanced two-photon absorption cross-sections," Chemical Communications, 2004, vol. 20, pp. 2342-2343.
Kaya et al., "Electrochromic and Optical Studies of Solution Processable Benzotriazole and Fluorene Containing Copolymers," Organic Electronics, vol. 12, No. 1, Jan. 2011, pp. 202-209.
Kaya et al., "Solution Processable Benzotriazole and Fluorene Containing Copolymers for Photovoltaic Applications," Solar Energy Materials and Solar Cells, Apr. 2012, vol. 91, pp. 321-326.
Krebs et al., "Product integration of compact roll-to-roll processed polymer solar cell modules: methods and manufacture using flexographic printing, slot-die coating and rotary screen printing," Journal Material Chemistry, 2010, 20, 8994-9001.
Lui et al., "White Electroluminescene from a Star-like Polymer with an Orange Emissive Core and Four Blue Emissive Arms," Advanced Materials, 2008, vol. 20, No. 7, pp. 1357-1362.
Lui et al., "Synthesis and Electroluminescent Properties of a Phenothiazine-Based Polymer for Nondoped Polymer Light-Emitting Diodes with a Stable Orange-Red Emission," Journal of Polymer Science Part A: Polymer Chemistry, Nov. 1, 2007, vol. 45, No. 21, pp. 4867-4878.
Lui et al., "Synthesis and Photovoltaic Properties of a Solution-Processable Organic Molecule Containing Dithienylbenzotriazole and Triphenylamine," Synthetic Metals, May 2012, vol. 162, No. 7-8, pp. 630-635.
Lui et al., "A Dithienyl Benzotriazole-based Polyfluorene: Synthesis and Applications in Polymer Solar Cells and Red Light-Emitting Diodes," Macromolecular Chemistry and Physics, 2011, vol. 212, No. 14, pp. 1489-196.
Mao et al., "Benzotriazole-Bridged Sensitizers Containing a Furan Moiety for Dye-Sensitized Solar Cells with High Open-Circuit Voltage Performance," Chemistry Asian Journal, 2012, pp. 982-991.
Mikroyannidis et al., "Synthesis of Benzoselenadiazole-Based Small Molecule and Phenylenevinylene Copolymer and their Application for Efficient Bulk Heterojunction Solar Cells," Organic Electronics, Feb. 2010, vol. 11, No. 2, pp. 311-321.
Pasker et al., "Photovoltaic Response to Structural Modifications on a Series of Conjugated Polymers Based on 1-Aryl-2H-Benzotriazoles," Polymer Chemistry, 2011, vol. 49, No. 23, pp. 5001-5011.
Price et al., "Fluorine Substituted Conjugated Polymer of Medium Banb Gap Yields 7% Efficiency in Polymer-Fullerence Solar Cells," Journal of the American Chemical Society, 2011, vol. 133, No. 12, pp. 4625-4631.
Tanimoto et al., "Synthesis of n-Type Poly(benzotriazole)s having p-Conducting and Polymerizable Carbazole Pendants," Macromolecules 2006, 39: pp. 35463552.
Thomas et al., "Color Tuning in Benzo[1,2,5]thiadiazole-Based Small Molecules by Amino Conjugation/Deconjugation: Bright Red-Light-Emitting Diodes," Advanced Functional Materials, Jan. 2004, vol. 14, No. 1, pp. 83-90.
Yang et al., "Theoretical Study of One-Photon Absorption Properties for 2,1,3-Benzothiadiazole-Based Red-Fluorescent Dyes," Journal of Molecular Structure: THEOCHEM, vol. 848, No. 1-3, Jan. 15, 2008, pp. 24-33.
Yasuda et al., "Benzothiadiazole-Triphenylamine Derivatives as Donor Materials for Bulk-Heterojunction Organic Solar Cells," Journal of Photopolymer Science and Technology, 2010, vol. 23, No. 3, pp. 307-312.
Yigitsoy et al., "Benzyl Substituted Benzotriazole Containing Conjugated Polymers: Effect of Position of the Substituent on Electrochromic Properties," Synthetic Metals, vol. 160, No. 23-24, Dec. 2010, pp. 2534-2539.
Zhang et al., "Synthesis and Photovoltaic Property of Alternating Copolymer Derived from 2,7-Carbazole and 4,7-Bis(2'-Thienyl)-2-Dodecyl-2,1,3-Benzotriazole," Polymer Preprints, 2011, vol. 52, No. 2, pp. 1000-1001.
Zhang et al., "Bulk-Heterojunction Solar Cells with Benzotriazole-Based Copolymers as Electron Donors: Largely Improved Photovoltaic Parameters by Using PFN/A1 Bilayer Cathode," Macrocolecules, 2010, vol. 43, pp. 9771-9778.
Tedlar Polyvinyl Fluoride Film, Du Pont—Product and Performance Guide, Dec. 1995, pp. 6.
International Preliminary Report on Patentability and Written Opinion in PCT Application No. PCT/US2012/058062, dated Apr. 8, 2014, 13 pages.
Bosio et al., Polycrystalline CdTe Thin Films for Photovolotaicapplications, Progress in Crystal Growth and Characterization of Materials, 2006, vol. 52, Iss. 4, pp. 247-279.
Van Ewyk et al., Anisotropic Fluorophors for Liquid Crystal Displays, Displays, 1986, vol. 7, Iss. 4, pp. 155-160.

\* cited by examiner

WAVELENGTH CONVERSION PERYLENE DIESTER CHROMOPHORES AND LUMINESCENT FILMS

CROSS-REFERENCE TO RELATED APPLICATIONS

This application is a national phase application under 35 U.S.C. §371 of International Application No. PCT/US2012/020209, filed Jan. 4, 2012, which claims priority to U.S. Provisional Patent Application No. 61/430,053, filed on Jan. 5, 2011 and entitled "Wavelength Conversion Perylene Diester Chromophores," and to U.S. Provisional Patent Application No. 61/485,093, filed on May 11, 2011 and entitled "Wavelength Conversion Perylene Diester Chromophores and Luminescent Films," the contents of both of which are hereby incorporated by reference in their entirety.

BACKGROUND OF THE INVENTION

1. Field of the Invention

The present invention generally relates to perylene diester chromophores which are useful as fluorescent dyes in various applications, including in wavelength conversion films. Such wavelength conversion films can significantly enhance the solar harvesting efficiency of photovoltaic or solar cell devices.

2. Description of the Related Art

In recent years, with the need for new optical light collection systems, fluorescence-based solar collectors, fluorescence-activated displays, and single-molecule spectroscopy, various approaches for preparing perylene dyes have been explored. However, many technical issues have yet to be overcome.

Several papers describe perylene backbone structure chromophores having good wavelength conversion capability. Typically, these chromophores emit longer wavelength fluorescence light upon illumination with shorter wavelength light. For example, Zhang et al., "Synthesis and characterization of perylene tetracarboxylic bisester monoimide derivatives," Dyes and Pigments Journal, 2008, vol. 76, pp. 810-816 reported n-(1-butyl)perylene-3,4,9,10-tetracarboxylic-3,4-(bis-alkylester)-9,10-imide (C4-Cn) and 1,3-bis[(n-(1-butyl)perylene-3,4:9,10-tetracarboxylic-3-alkylester-9,10-imide)-4-ester]dioxypropane (C4-C3-C4), which show good fluorescence behavior and long stoke-shift wavelength values. Additionally, Jones et al., "Tuning Orbital Energetics in Arylene Diimide Semiconductors. Materials Design for Ambient Stability of n-Type Charge Transport," J. Am. Chem. Soc., 2007, 129, pp. 15259-15278, described perylene bisimide derivatives synthesized from perylene dianhydrides, which also showed good fluorescence behavior.

Other references have been disclosed regarding perylene derivatives structures and synthetic procedures, along with their areas of application. For example, see U.S. Patent Application Publication Nos. 2008/0087878 and 2008/0114170, and U.S. Pat. Nos. 5,808,073, 6,136,976, 5,472,494, 6,063,181, 6,184,378, 6,326,494, 6,806,368, 6,986,811, 4,262,851, 4,379,934, 4,419,427, 4,446,324, 4,450,273, 4,618,694, 4,667,036, 4,725,690, and 4,845,223, which were disclosed and filed by BASF. Also see U.S. Pat. Nos. 5,077,161 and 5,645,965, were also disclosed and filed by Xerox corp. Also see U.S. Pat. Nos. 5,693,808, 5,874,580, 5,981,773, and 6,166,210, which were disclosed and filed from Chiba Specialty Chemicals Co. Also see U.S. Pat. Nos. 5,019,473, 5,141,837, 5,028,504, 4,746,741, and 4,968,571, which were disclosed from Eastman Kodak Co. Also see U.S. Pat. Nos. 5,123,966, 5,248,774, 5,154,770, 5,264,034, 5,466,807, 4,431,808, 4,501,906, 4,709,029, 4,594,420, and 4,831,140, which were disclosed and filed from Hoechest. Each of the references and patents disclosed herein is hereby incorporated by reference in its entirety.

These references describe various tetra-carboxylic and di-carbonyl perylene derivatives, which include free acid, ester, amide, and imide groups. Most of the di-carbonyl derivatives have two carbonyl groups, which are attached to a peripheral position, such as the 3- and 4-positions of the perylene rings. However, only limited examples disclose para-position di-carbonyl perylene derivatives which contain two carbonyl groups in the para-position of the perylene structure, e.g. the 3- and 9-(or 10-) position of the perylene ring. Examples of di-carbonyl para-position perylene derivative structure were disclosed in U.S. Pat. No. 4,618,694; however, the disclosure was limited to 3- & 9-position di-carbonyl para-position perylene derivatives, in which a cyano group is attached to the 4-position of the perylene.

One of the useful properties of fluorescent (or photo-luminescent) dyes is their ability to absorb a light photon of a particular wavelength, and re-emit the photon at a different wavelength. This phenomenon makes them useful in the photovoltaic industry. The utilization of solar energy offers a promising alternative energy source to the traditional fossil fuels, and therefore, the development of devices that can convert solar energy into electricity, such as photovoltaic devices (also known as solar cells), has drawn significant attention in recent years.

Several different types of mature photovoltaic devices have been developed, including a silicon based device, a III-V and II-VI PN junction device, a Copper-Indium-Gallium-Selenium/Diselenide (CIGS) thin film device, an organic sensitizer device, an organic thin film device, and a Cadmium Sulfide/Cadmium Telluride (CdS/CdTe) thin film device. More detail on these devices can be found in the literature, such as Lin et al., "High Photoelectric Conversion Efficiency of Metal Phthalocyanine/Fullerene Heterojunction Photovoltaic Device" (International Journal of Molecular Sciences, vol. 12, pp. 476, 2011), the contents of which are hereby incorporated by reference. However, the photoelectric conversion efficiency of these devices can still be improved and the development of techniques for such improvement has been an ongoing challenge for many researchers.

One technique developed to improve the efficiency of photovoltaic devices is to utilize a wavelength down-shifting film. Many of the photovoltaic devices are unable to effectively utilize the entire spectrum of light as the materials on the device absorb certain wavelengths of light (typically the shorter UV wavelengths) instead of allowing the light to pass through to the photoconductive material layer where it is converted into electricity. Application of a wavelength down-shifting film absorbs the shorter wavelength photons and re-emits them at more favorable longer wavelengths, which can then be absorbed by the photoconductive layer in the device, and converted into electricity.

This phenomenon is observed in the thin film CdS/CdTe and CIGS solar cells which both use CdS as the window layer. The low cost and high efficiency of these thin film solar cells has drawn significant attention in recent years, with typical commercial cells having photoelectric conversion efficiencies of 10-16%. However, one issue with these devices is the energy gap of CdS, approximately 2.41 eV, which causes light at wavelengths below 514 nm to be absorbed by the CdS instead of passing through to the photoconductive layer where it can be converted into energy. This inability to utilize the entire spectrum of light effectively reduces the overall photoelectric conversion efficiency of the device.

There are three principal approaches to achieve a more efficient utilization of the short wavelength solar spectrum in the CdS/CdTe devices which have been described in the literature, for example see Klampaftis et al. in "Enhancing the performance of solar cells via luminescent down-shifting of the incident spectrum: A review" (Solar Energy Materials and Solar Cells, vol. 93, pp. 1182-1194, 2009). The first approach is to reduce the absorption loss by reducing the CdS layer thickness. However, this approach negatively affects the lifetime and performance of the device. The second approach is to replace the CdS materials with wider band gap materials, such as ZnSe or ZnTe. However, these materials are more expensive and difficult to use. The third approach is to utilize a wavelength down-shifting material.

There have been numerous reports disclosing the utilization of a wavelength down-shifting material to improve the performance of photovoltaic devices. For example, U.S. Patent Application Publication No. 2009/0151785 discloses a silicon based solar cell device which contains a wavelength down-shifting inorganic phosphor material. U.S. Patent Application Publication No. US 2011/0011455 discloses an integrated solar cell comprising a plasmonic layer, a wavelength conversion layer, and a photovoltaic layer. U.S. Pat. No. 7,791,157 discloses a solar cell with a wavelength conversion layer containing a quantum dot compound. U.S. Patent Application Publication No. 2010/0294339 discloses an integrated photovoltaic device containing a luminescent down-shifting material, however no example embodiments were constructed. U.S. Patent Application Publication No. 2010/0012183 discloses a thin film solar cell with a wavelength down-shifting photo-luminescent medium; however, no examples are provided. Each of these patents and patent application publications, which are incorporated herein by reference in their entirety, specifically promote the use of an inorganic material to enable the wavelength down-shifting.

While there have been numerous disclosures of wavelength down-shifting inorganic mediums used in photovoltaic and solar cell devices, there has been very little work reported on the use of photo-luminescent organic mediums for efficiency improvements in photovoltaic devices. The use of an organic medium, as opposed to an inorganic medium, is attractive in that organic materials are typically cheaper and easier to use, making them a better economical choice. However, the poor photostability of the organic luminescent dyes has inhibited their development. Some theoretical modeling and/or simulation of luminescent films applied to CdS/CdTe solar cells is described in the following literature: U.S. Patent Application Publication No. 2010/0186801; B. S. Richards and K. R. McIntosh in "Overcoming the Poor Short Wavelength Spectral Response of CdS/CdTe Photovoltaic Modules via Luminescence Down-Shifting: Ray-Tracing Simulations" (Progress in Photovoltaics: Research and Applications, vol. 15, pp. 27-34, 2007); and T. Maruyama and R. Kitamura in "Transformations of the wavelength of the light incident upon solar cells" (Solar Energy Materials and Solar Cells, vol. 69, pp. 207, 2001); however, no actual experiments have been performed.

Furthermore, much of the literature cautions against using photo-luminescent organic media as the stabilities of these materials are insufficient, for example see U.S. Patent Application Publication No. 2010/0012183. Most commercially available photo-luminescent media, including fluorescent dyes, exhibit photobleaching only days after solar illumination. An 11% efficiency enhancement of a CdS/CdTe cell by using Rhodamine 6G/Polyvinyl butyral film was reported by B. C. Hong and K. Kawano in "Organic dye-doped thin films for wavelength conversion and their effects on photovoltaic characteristics of CdS/CdTe solar cell" (Japan Journal of Applied Physics, vol. 43, pp. 1421-1426, 2004); however the photostability of this film was very poor under one sun (AM1.5G) irradiation. AM1.5G is a standard terrestrial solar spectral irradiance distribution as defined by the American Society for Testing and Materials (ASTM) standard 2006, see ASTM G-173-03.

According to Klampaftis et al. (Solar Energy Materials and Solar Cells 2009), only two experiments have been reported where a luminescent down-shifting material layer has been added to a Copper Indium Diselinide/Sulfide (CIS)-based cell (CIS-based devices include CIGS cells). G. C. Glaeser and U. Rau in "Improvement of photon collection in Cu(In,Ga)Se2 solar cells and modules by fluorescent frequency conversion" (Thin Solid Films, vol. 515, pp. 5964-5967, 2007) showed a 4% efficiency enhancement using a commercially available organic luminescent dye (Lumogen-F), and Muffler et al. in "Colloid attachment by ILGAR-layers: creating fluorescing layers to increase quantum efficiency of solar cells" (Solar Energy Materials and Solar Cells, vol. 90, pp. 3143-3150, 2006), reported a 3% efficiency enhancement using a quantum dot based luminescent film, however in both of these reports no data on the stability of the film was reported.

SUMMARY OF THE INVENTION

Thus, a primary objective of the present invention is to provide a wavelength conversion luminescent dye formed from a perylene diester derivative. By employing the luminescent dye, a new type of optical light collection system, fluorescence-based solar collectors, fluorescence-activated displays, and single-molecule spectroscopy can be provided. It has been discovered by the inventors that such luminescent dyes can greatly enhance the photoelectric conversion efficiency of thin film solar cells. Furthermore, the disclosed luminescent medium that comprises a perylene diester derivative yields extremely good photostability, which renders the thin film structure very attractive for efficiency enhancement in thin film solar cell development.

An embodiment provides a perylene diester derivative represented by the following general formula (I) or general formula (II):

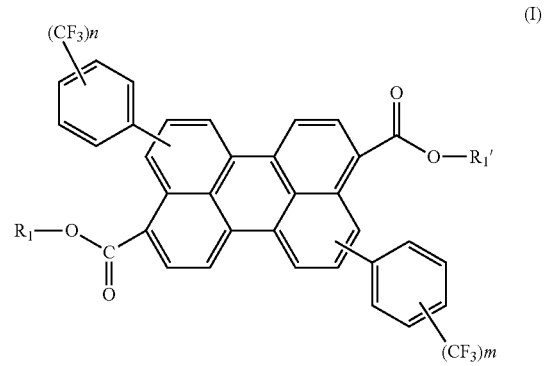

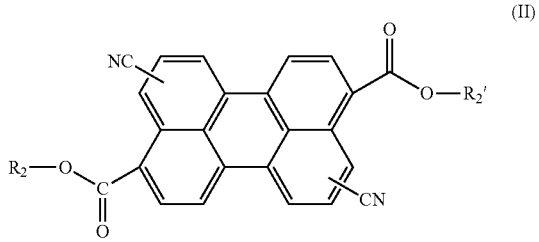

(II)

wherein $R_1$ and $R_1'$ in formula (I) are each independently selected from the group consisting of hydrogen, $C_1$-$C_{10}$ alkyl, $C_3$-$C_{10}$ cycloalkyl, $C_2$-$C_{10}$ alkoxyalkyl, $C_6$-$C_{18}$ aryl, and $C_6$-$C_{20}$ aralkyl; m and n in formula (I) are each independently in the range of from 1 to 5; and $R_2$ and $R_2'$ in formula (II) are each independently selected from the group consisting of a $C_6$-$C_{18}$ aryl and $C_6$-$C_{20}$ aralkyl. In an embodiment, if one of the cyano groups on formula (II) is present on the 4-position of the perylene ring, then the other cyano group is not present on the 10-position of the perylene ring. In an embodiment, if one of the cyano groups on formula (II) is present on the 10-position of the perylene ring, then the other cyano group is not present on the 4-position of the perylene ring.

In an embodiment, $R_1$ and $R_1'$ are independently selected from the group consisting of hydrogen, $C_1$-$C_6$ alkyl, $C_2$-$C_6$ alkoxyalkyl, and $C_6$-$C_{18}$ aryl. In an embodiment, $R_1$ and $R_1'$ are each independently selected from the group consisting of isopropyl, isobutyl, isohexyl, isooctyl, 2-ethyl-hexyl, diphenylmethyl, trityl, and diphenyl. In an embodiment, $R_2$ and $R_2'$ are independently selected from the group consisting of diphenylmethyl, trityl, and diphenyl. In an embodiment, each m and n in formula (I) is independently in the range of from 1 to 4.

An embodiment provides an organic down-shifting luminescent medium, comprising an optically transparent polymer matrix and at least one luminescent dye. In an embodiment, the organic down-shifting luminescent medium receives as input at least one photon having a first wavelength, and provides as output at least one photon having a second wavelength, wherein the second wavelength is longer than the first wavelength. In an embodiment, the luminescent dye comprises a perylene diester derivative represented by the general formula (I) or general formula (II), as outlined above. In an embodiment, the polymer matrix comprises a polymer selected from the group consisting of polymethyl methacrylate, polyvinyl butyral, ethylene vinyl acetate, ethylene tetrafluoroethylene, polyimide, amorphous polycarbonate, polystyrene, siloxane sol-gel, polyurethane, polyacrylate, and combinations thereof.

An embodiment provides a photovoltaic module for the conversion of solar light energy into electricity. In an embodiment, the photovoltaic module comprises at least one photovoltaic device or solar cell, and an organic down-shifting luminescent medium. In an embodiment, the luminescent medium comprises an optically transparent polymer matrix and at least one luminescent dye, wherein the luminescent dye comprises a perylene diester derivative represented by the general formula (I) or general formula (II), as outlined above. In an embodiment, the organic down-shifting luminescent medium is incorporated on top of, or incorporated, e.g. encapsulated, into, the photovoltaic device or solar cell. In an embodiment, incident light that passes through the organic down-shifting luminescent medium prior to reaching an area of the photovoltaic module where solar light energy is converted into electricity.

An embodiment provides a method for improving the performance of a photovoltaic device or a solar cell. In an embodiment, the method comprises applying an organic down-shifting luminescent medium directly onto the light incident side of the photovoltaic device or solar cell. In an embodiment, the luminescent medium comprises an optically transparent polymer matrix and at least one luminescent dye, wherein the luminescent dye comprises a perylene diester derivative represented by the general formula (I) or general formula (II), as outlined above.

An embodiment provides a method for improving the performance of a photovoltaic device or solar cell. In an embodiment, the method comprises incorporating an organic down-shifting luminescent medium directly into the photovoltaic device or solar cell during its fabrication. In an embodiment, the organic down-shifting luminescent medium is between the photovoltaic device or solar cell and a cover substrate on the light incident side. In an embodiment the cover substrate is a glass plate. In another embodiment the cover substrate comprises a polymer material selected from the group consisting of polymethyl methacrylate, polyvinyl butyral, ethylene vinyl acetate, ethylene tetrafluoroethylene, polyimide, polycarbonate, polystyrene, siloxane sol-gel, polyurethane, polyacrylate, and combinations thereof. In an embodiment, the luminescent medium comprises an optically transparent polymer matrix and at least one luminescent dye, wherein the luminescent dye comprises a perylene diester derivative represented by the general formula (I) or general formula (II), as outlined above.

Various photovoltaic devices and solar cells can be used in conjunction with the perylene diester derivatives and methods described herein. In an embodiment, the photovoltaic device or solar cell device comprises a CdS/CdTe solar cell. In an embodiment, the photovoltaic device or solar cell comprises a CIGS solar cell.

It is an object of the present invention to utilize the perylene diester luminescent derivatives, disclosed herein, in a photostable organic down-shifting luminescent medium. The perylene diester derivative absorbs high energy photons with wavelengths less than about 510 nm and then effectively converts them into low energy photons with wavelengths longer than 510 nm. With application of this organic down-shifting luminescent medium, the CdS/CdTe or CIGS solar cells will achieve higher solar harvesting efficiency because of the enhanced ability to utilize a wider spectrum of solar irradiation compared to devices that do not contain the organic down-shifting luminescent medium. The disclosed luminescent medium can yield extremely good photostability which makes the utilization of a thin film structure composed of the medium very attractive for efficiency enhancement in thin film solar cell development.

Additional uses for organic down-shifting photo-luminescent mediums also exist, for example Currie et al. in "High-Efficiency Organic Solar Concentrators for Photovoltaics" (Science, vol. 321, pp. 226, 2008) examined the use of organic down-shifting luminescent mediums as a luminescent solar concentrator (LSC). The LSC consists of a luminescent dye and a transparent waveguide, which acts to redirect the angled incident light directly into the solar cell device, so that the solar energy is maximized by concentrating the light into the photovoltaic device. Conventional solar concentrators utilize reflective mirrors and refractive lens devices to focus light onto the solar cell. These devices are fairly bulky structures occupying substantial volume, for example see U.S. Patent Application Nos. 20100278480 A1 and 20100224248 A1, which are incorporated herein by reference in their entirety. Therefore, the ability to utilize an organic down-shifting luminescent medium, as disclosed herein, in conjunction with a transparent waveguide, which can be applied directly on top of or incorporated into a solar cell device, to act as a solar concentrator, can significantly enhance the photoelectric conversion efficiency.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

DETAILED DESCRIPTION OF THE PREFERRED EMBODIMENT

Figure 1:
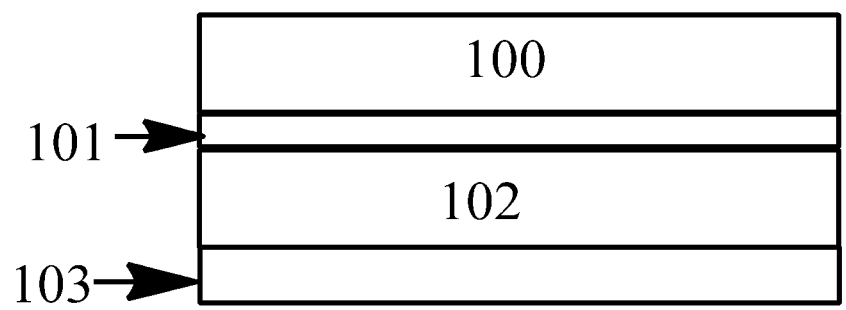
FIG. 1 illustrates a photovoltaic module in which a thin film organic down-shifting luminescent medium is attached to the light incident surface substrate of a solar cell using a refractive index matching liquid.

The perylene diester chromophores represented by general formulae (I) and (II) are useful as fluorescent dyes in various applications, including in wavelength conversion films. Each of the alkyl, cycloalkyl, alkoxy, alkoxyalkyl, aryl, and aralkyl groups, as described herein can be "optionally substituted" with one or more substituent group(s). When substituted, the substituent group(s) is(are) one or more group(s) individually and independently selected from alkyl, alkenyl, alkynyl, cycloalkyl, cycloalkenyl, cycloalkynyl, aryl, heteroaryl, heteroalicyclyl, aralkyl, heteroaralkyl, (heteroalicyclyl)alkyl, hydroxy, protected hydroxyl, alkoxy, aryloxy, acyl, ester, mercapto, alkylthio, arylthio, cyano, halogen, carbonyl, thiocarbonyl, O-carbamyl, N-carbamyl, O-thiocarbamyl, N-thiocarbamyl, C-amido, N-amido, S-sulfonamido, N-sulfonamido, C-carboxy, protected C-carboxy, O-carboxy, isocyanato, thiocyanato, isothiocyanato, nitro, silyl, sulfenyl, sulfinyl, sulfonyl, haloalkyl, haloalkoxy, trihalomethanesulfonyl, trihalomethanesulfonamido, and amino, including mono- and di-substituted amino groups, and the protected derivatives thereof.

An alkyl group may be a linear alkyl or a branched alkyl group. Some examples include methyl, ethyl, n-propyl, isopropyl, n-butyl, isobutyl, sec-butyl, tert-butyl, isohexyl, isooctyl, and 2-ethyl-hexyl. An alkoxy group may also be linear or branched. Some examples of useful alkoxy groups include methoxy, ethoxy, propoxy, and butoxy. An alkoxyalkyl group may also be linear or branched. Some examples of useful alkoxyalkyl groups include methoxymethyl, methoxyethyl, methoxypropyl, ethoxymethyl, ethoxyethyl, ethoxypropyl, propoxymethyl, propoxyethyl, and propoxypropyl. Some examples of useful cycloalkyl groups include cyclopentyl, cyclohexyl, or cyloheptyl. Some examples of useful aryl groups include phenyl, diphenyl, tolyl, naphthyl, phenanthryl, and anthracenyl. Some examples of useful aralkyl groups include benzyl, phenethyl, diphenylmethyl, trityl, naphthylmethyl, phenanthylmethyl, and anthranylmethyl.

Preferably, $R_1$ and $R_1'$ in formula (I) are each independently selected from the group consisting of hydrogen, $C_1$-$C_6$ alkyl, $C_2$-$C_6$ alkoxyalkyl and $C_6$-$C_{18}$ aryl, and $C_6$-$C_{20}$ aralkyl. The alkyl and alkoxyalkyl groups may be branched or linear. Some non-limiting examples include isopropyl, isobutyl, isohexyl, isooctyl, 2-ethyl-hexyl. Some non-limiting examples of aryl and aralkyl groups include diphenylmethyl, trityl, and diphenyl.

Also, preferably $R_2$ and $R_2'$ in formula (II) are each independently selected from $C_6$-$C_{18}$ aryl and $C_6$-$C_{20}$ aralkyl. For example, $R_2$ and $R_2'$ can be independently selected from the group consisting of diphenylmethyl, trityl, and diphenyl.

Synthetic methods for making chromophores according to the general formula (I) are not restricted, but typically the following synthetic procedure, which is described as Scheme 1 and further illustrated below in the Examples, can be used.

Scheme 1: general synthetic procedure for making chromophores of general formula (I)

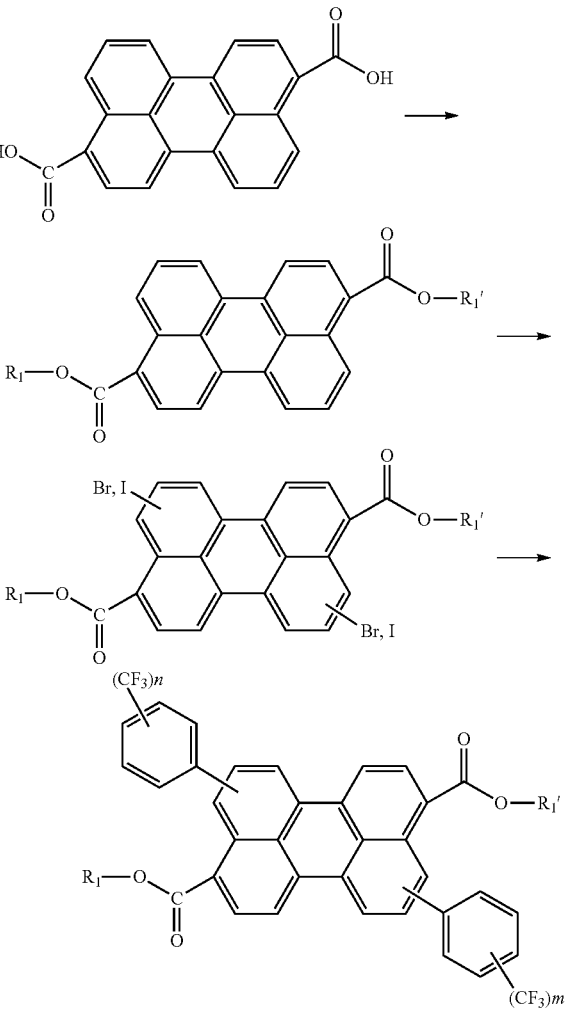

In the first step of Scheme 1, perylenedicarboxylic acid is converted into the corresponding diester by using typical esterification methods, known to those having ordinary skill in the art guided by the present disclosure. In the second step, perylenedicarboxylic acid di-ester is converted into either the dibromo or diiodo derivative by using a bromination/iodination reagent, under conditions known to those skilled in the art guided by the present disclosure. Some examples of these types of reagents include N-bromosuccinimide (NBS) and N-iodosuccinimide (NIS). The third step of Scheme 1 is to couple the corresponding perylenedicarboxylic acid di-ester iodo/bromo with the —CF₃ group containing boronic acid derivative in the presence of a catalyst. If more than one —CF₃ group is to be coupled to the perylene core, then additional bromine or iodine atoms are added during the second step, described above. Those having ordinary skill in the art will recognize that many catalysts can be used, but typical examples include palladium complex derivatives and copper derivatives.

Synthetic methods for chromophores according to the general formula (II) are not restricted, but typically the following synthetic procedure, which is described as Scheme 2 and further illustrated below in the Examples, can be used.

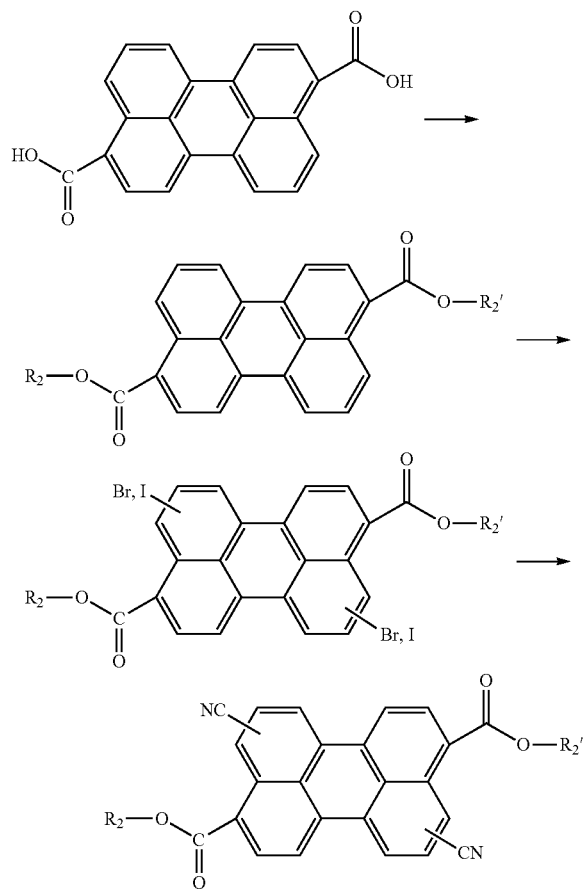

Scheme 2: general synthetic procedure for chromophores of general formula (II)

In the first step of Scheme 2, perylenedicarboxylic acid is converted into the corresponding diester by using typical esterification methods, known to those having ordinary skill in the art guided by the present disclosure. In the second step, perylenedicarboxylic acid di-ester is converted into either the dibromo or diiodo derivative by using a bromination/iodination reagent. Some examples of these types of reagents include N-bromosuccinimide (NBS) and N-iodosuccinimide (NIS). The third step of Scheme 2 is a conversion reaction from the perylenedicarboxylic acid di-ester iodo/bromo into the cyano derivatives by methods known to the person of ordinary skill in the art, such as by reaction with copper cyanide, guided by the present disclosure.

An object of this invention is to provide chromophore compounds which may be suitable for fluorescence films which can be used for various applications, such as concentrating light and harvesting, by having long wavelength conversion efficiency and high fluorescence quantum efficiency. By using these chromophores, excellent light conversion effects may be provided.

Described herein are organic down-shifting photo-luminescent media, and a photovoltaic module which utilizes the same, to enhance the photoelectric conversion efficiency of a photovoltaic device. In an embodiment, the organic down-shifting luminescent medium comprises an optically transparent polymer matrix and at least one organic luminescent dye. In an embodiment, the luminescent dye comprises a perylene diester derivative, as represented by the above general formula (I) and general formula (II). Wavelength down-shifting media are useful in various applications, such as optical light collection systems, fluorescence-based solar collectors, fluorescence-activated displays, and single-molecule spectroscopy.

Described herein are methods to enhance the photoelectric conversion efficiency of photovoltaic devices or solar cells. In an embodiment, the photovoltaic device or solar cell comprises a light incident surface substrate. Many of these photovoltaic devices or solar cells utilize materials on the light incident side of the device which absorb certain wavelengths of the solar spectrum, typically shorter ultra violet (UV) wavelengths, instead of allowing the light to pass through to the photoconductive material of the device. This UV absorption effectively reduces the efficiency of the photovoltaic device or solar cell. The use of a down-shifting medium in the photovoltaic devices and solar cells, when applied to the light incident side of the device, causes the shorter wavelength light to become excited and re-emitted from the medium at a longer (e.g., higher) more favorable wavelength, which can then be utilized by the photovoltaic device or solar cell. This mechanism effectively enhances the photoelectric conversion efficiency by allowing a wider spectrum of solar energy to be converted into electricity.

Traditionally, the use of organic luminescent mediums as a wavelength down-shifting material has been avoided due to their poor photostability properties. Surprisingly, the inventors have discovered that the organic-based wavelength down-shifting luminescent medium disclosed herein have good photostability. In an embodiment, the luminescent medium disclosed herein remains stable for greater than 500 hours. In an embodiment, the luminescent medium disclosed herein remains stable for greater than 1000 hours. In an embodiment, the luminescent medium disclosed herein remains stable for greater than 2000 hours. In an embodiment, the luminescent medium disclosed herein remains stable for greater than 3000 hours. In an embodiment, the luminescent medium disclosed herein remains stable for greater than 4000 hours. In an embodiment, the luminescent medium disclosed herein remains stable for greater than 5000 hours. Advantageously, the use of an organic medium, instead of an inorganic medium, to enhance the efficiency of photovoltaic devices or solar cells has the potential to significantly lower the device cost as these organic materials are much cheaper to synthesize and apply. The organic down-shifting luminescent medium receives as input at least one photon having a first wavelength, and provides as output at least one photon having a second wavelength which is longer (e.g., higher) than the first.

The organic down-shifting luminescent medium is incorporated on top of, or encapsulated into, a photovoltaic device or solar cell, such that the incident light passes through the organic down-shifting luminescent medium prior to reaching the area of the module where the solar light energy is converted into electricity.

Another aspect of the invention is a method for improving the performance of a photovoltaic or solar cell device comprising applying an organic down-shifting luminescent medium directly onto the light incident side of the solar cell or photovoltaic device. Another aspect of the invention, is a method for improving the performance of a photovoltaic device or solar cell, comprising incorporating an organic down-shifting luminescent medium directly into the photovoltaic or solar cell device during fabrication, so that the organic down-shifting luminescent medium is between the photovoltaic or solar cell device and its cover substrate on the light incident side.

Various polymers can be used in the polymer matrix of the organic down-shifting luminescent medium. In an embodiment, the optically transparent polymer matrix comprises a substance selected from the group consisting of polymethyl methacrylate, polyvinyl butyral, ethylene vinyl acetate, ethylene tetrafluoroethylene, polyimide, amorphous polycarbonate, polystyrene, siloxane sol-gel, polyurethane, polyacrylate, and combinations thereof. In an embodiment, the refractive index of the optically transparent polymer matrix is in the range of about 1.400 to about 1.700. In an embodiment, the refractive index of the optically transparent polymer matrix is in the range of about 1.450 to about 1.550.

The luminescent dye concentration in the polymer matrix may vary over a wide range in the organic down-shifting luminescent medium. In an embodiment, the luminescent dye is present in the polymer matrix in an amount in the range of about 0.01 wt % to about 3.0 wt %. In an embodiment, the luminescent dye is present in the polymer matrix in an amount in the range of about 0.05 wt % to about 1.0 wt %.

In an embodiment, the organic down-shifting luminescent medium comprises a luminescent film. The luminescent film thickness may vary over a wide range. In an embodiment, the luminescent film thickness is in the range of about 0.1 μm to about 1 mm. In an embodiment, the luminescent film thickness is in the range of about 0.5 μm to about 0.5 mm. In an embodiment, the luminescent film thickness is in the range of about 1 μm to about 100 μm.

Fabrication of the luminescent film can be performed many ways. For example, an organic down-shifting luminescent medium, which comprises an optically transparent polymer matrix and at least one luminescent dye, can be fabricated into a thin film structure in accordance with the following steps. First, prepare a polymer solution with dissolved polymer powder in tetrachloroethylene (TCE) at a predetermined ratio. Second, prepare a luminescent dye containing a polymer mixture by mixing the polymer solution with the luminescent dye at a predetermined weight ratio to obtain a dye-containing polymer solution. Third, form a dye/polymer thin film by directly casting the dye-containing polymer solution onto a glass substrate, then heat treat the substrate from room temperature up to about 100° C. in 2 hours, completely removing the remaining solvent by further vacuum heating at 130° C. overnight. Then, peel off the dye/polymer thin film under water and dry out the free-standing polymer film before use. The film thickness can be controlled by varying the dye/polymer solution concentration and evaporation speed.

FIG. 1 shows a photovoltaic module, or solar cell 103 in which a thin film organic down-shifting luminescent medium 100 is attached to the light incident surface substrate 102 of a solar cell 103 using a refractive index matching liquid 101. In an embodiment the refractive index matching liquid 101 comprises a Series A mineral oil comprising aliphatic and alicyclic hydrocarbons, and hydrogenated terphenyl, available from Cargille-Sacher Laboratories, Inc. In an embodiment, the refractive index matching liquid 101 is applied between the luminescent medium 100 and the front surface substrate 102 of the solar cell 103 to ensure better light out-coupling efficiency.

Figure 2:
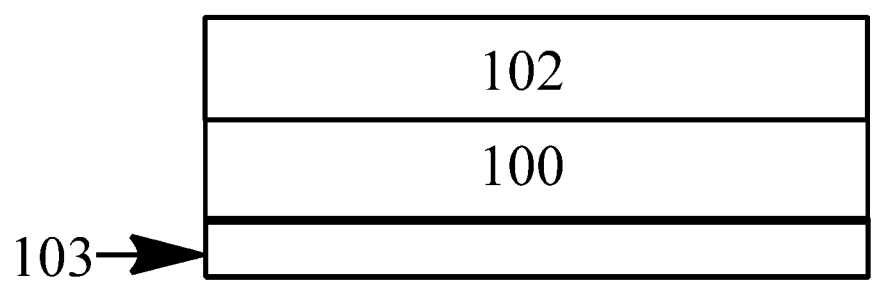
FIG. 2 illustrates a photovoltaic module in which a thin film organic down-shifting luminescent medium is fabricated directly into the module as an encapsulation layer between the optically transparent light incident surface substrate of the module and the solar cell.

FIG. 2 illustrates a photovoltaic module, or solar cell 103 in which a thin film organic down-shifting luminescent medium 100 is fabricated directly into the module as an encapsulation layer between the optically transparent light incident surface substrate 102 of the solar cell or module. This configuration is possible due to the excellent photostability of the luminescent film disclosed herein. The luminescent film 100 is between the solar cell module 103 and its front cover substrate 102. In an embodiment the cover substrate is a glass plate. In another embodiment the cover substrate comprises a polymer material selected from the group consisting of polymethyl methacrylate, polyvinyl butyral, ethylene vinyl acetate, ethylene tetrafluoroethylene, polyimide, polycarbonate, polystyrene, siloxane sol-gel, polyurethane, polyacrylate, and combinations thereof.

Various photovoltaic devices and solar cells can be used with the organic down-shifting luminescent media described herein. In an embodiment, the solar cell is a CdS/CdTe solar cell. In another embodiment, the solar cell is a CIGS solar cell. In an embodiment, the solar cell efficiency is measured with and without the thin film organic down-shifting luminescent medium under one sun irradiation (AM1.5G) by using a Newport solar simulator system. The efficiency enhancement of the CdS/CdTe solar cell with the luminescent medium is determined by the equation below:

$$\text{Efficiency Enhancement} = (\eta_{cell+luminescent\,film} - \eta_{cell})/\eta_{cell} * 100\%$$

In an embodiment, a CdS/CdTe solar cell with an efficiency $\eta_{cell}$ of 11.3%, which is similar to the efficiency level achieved in most commercially available CdS/CdTe cells, is modified with an organic down-shifting luminescent medium according to the method disclosed herein, and the efficiency enhancement is determined to be greater than 8%. In an embodiment, the efficiency enhancement is determined to be greater than 10%. In an embodiment, the efficiency enhancement is determined to be greater than 12%. In an embodiment, the efficiency enhancement is determined to be greater than 15%.

In an another embodiment, a CIGS solar cell with an efficiency $\eta_{cell}$ of 14.0%, which is slightly higher than the efficiency level achieved in most commercially available CIGS cells, is modified with an organic down-shifting luminescent medium according to the method disclosed herein, and the efficiency enhancement is determined to be greater than 8%. In an embodiment, the efficiency enhancement is determined to be greater than 10%. In an embodiment, the efficiency enhancement is determined to be greater than 12%.

Photostability of the organic down-shifting luminescent medium under one sun irradiation is an important parameter for its application in the solar cell industry. In an embodiment, the photostability of the thin film organic down-shifting luminescent medium disclosed herein is measured by monitoring its absorption peak optical density (O.D.) changes upon continuous one sun (AM1.5G) irradiation under ambient temperature. The thin film organic down-shifting luminescent medium is encapsulated in a moisture and oxygen free environment to prolong the lifetime. This is a standard procedure in the solar cell industry because the moisture and oxygen will destroy the light incident surface transparent conductive electrode layer, which will reduce the cell efficiency over a long period of usage. A luminescent medium with excellent photostability will maintain the peak O.D. over a long time period of exposure to one sun irradiation. The luminescent film is determined to be degraded when its O.D. drops below 1/e of the initial O.D. number. In an embodiment, the thin film organic down-shifting luminescent medium fabricated using the method disclosed herein, has surprisingly good photostability with no indication of O.D. change even after 5000 hours of continuous illumination under one sun (AM1.5G) irradiation.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the examples which follow.

EXAMPLES

The embodiments will be explained with respect to preferred embodiments which are not intended to limit the present invention. In the present disclosure, the listed substituent groups include both further substituted and unsubstituted groups unless specified otherwise. Further, in the present disclosure where conditions and/or structures are not specified, the skilled artisan in the art can readily provide such conditions and/or structures, in view of the present disclosure, as a matter of routine experimentation guided by the present disclosure.

Example 1

Synthesis of diisobutyl 4,10-bis(4-(trifluoromethyl)phenyl)perylene-3,9-dicarboxylate a) Step-1

Compound 1

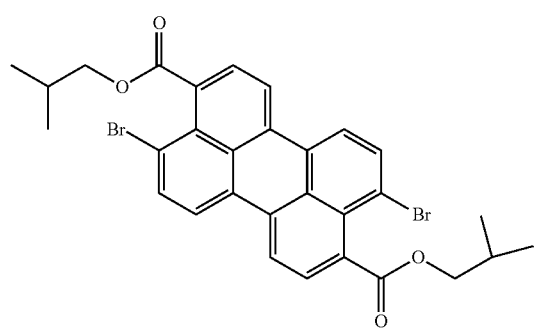

To synthesize diisobutyl 4,10-dibromoperylene-3,9-dicarboxylate ("Compound 1"), N-bromosuccinimide (7.85 g, 44 mmol) was added to a solution of perylenedicarboxylic acid diisobutyl ester, which can be purchased from Aldrich Chemical Co. Perylenedicarboxylic diisobutyl ester was also synthesized from the corresponding di-acid derivative by esterification with isobutyl alcohol in DMF (50 ml) under heat at 65° C. for 3 hours (until the initial suspension changes to a clear solution). After cooling, methanol (500 ml) was added to the stirred reaction mixture. Soon heavy precipitate was formed, which was separated by filtration, washed with small portion of cold methanol, and dried in a vacuum oven to give the above Compound 1 as a yellow solid, pure by $^1$H NMR (9.6 g, 78%).

b) Step 2

Compound 2

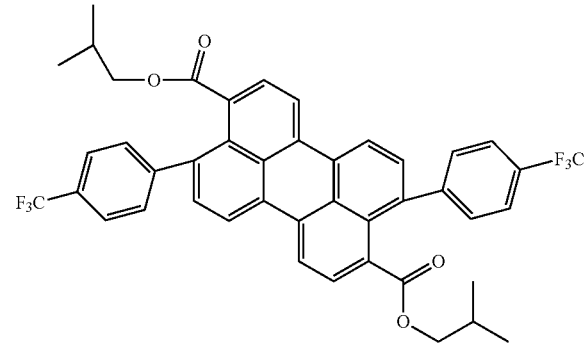

To synthesize diisobutyl 4,10-bis(4-(trifluoromethyl)phenyl)perylene-3,9-dicarboxylate ("Compound 2"), tetrakis(triphenylphosphine)palladium(0) (500 mg, 0.43 mmol) was added to a solution of Compound 1 (3.05 g, 5 mmol), 4-trifluoromethylphenylboronic acid (2.09 g, 11.0 mmol) in a mixture of toluene (50 mL), an aqueous solution of 2M $Na_2CO_3$ (20 mL), and ethanol (30 mL) under argon atmosphere. The reaction mixture was heated at 90° C. for 1 hour (until clear separation of organic layer, water, and solid was observed). The organic layer was separated and filtered through Celite to remove the palladium catalyst, then the solvent was partially removed under vacuum. The product was precipitated from methanol, filtrated off, washed with cold methanol, and dried in a vacuum oven to give pure Compound 2 (by $^1$H NMR) as a yellow solid (3.30 g, 89%). Alternative purification was performed by column chromatography (silica gel and a mixture of hexane-ethyl acetate 4:1 as mobile phase).

Example-2

Synthesis of bis-(diphenylethyl) 4,10-dicyanoperylene-3,9-dicarboxylate a) Step-1

Compound 3

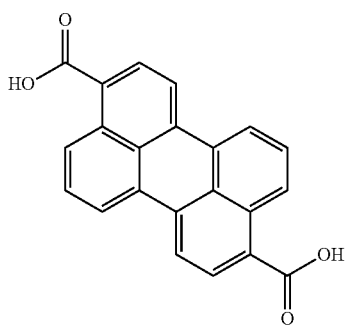

To synthesize Compound 3, perylenedicarboxylic acid diisobutyl ester (9.1 g, 20 mmol) was reacted with KOH (5.6 g, 100 mmol) in ethoxyethanol (100 ml) at reflux temperature overnight. After cooling, water (approx. 500 ml) was added and the solution was acidified with 6 M HCl to yield a red solid which was separated by filtration. The solid was washed with water and dried to give 6.2 g of highly insoluble solid (for TLC EA/MeOH solution was used). Reaction was monitored by TLC only (silica gel, Hex/EA 4:1) until no more of the starting material was detected.

b) Step-2

Compound 4

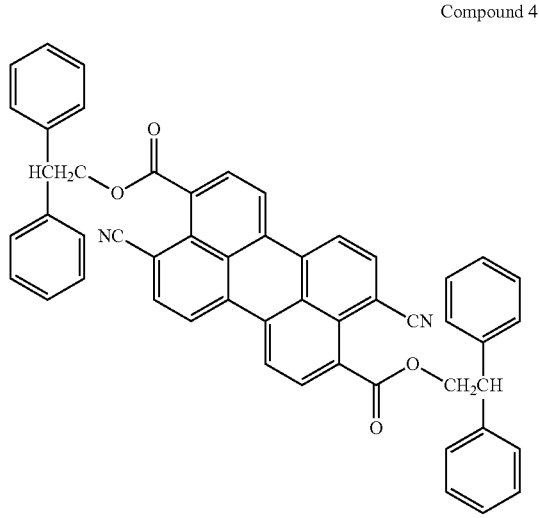

To synthesize Compound 4, bis-(diphenylethyl) 4,10-dicyanoperylene-3,9-dicarboxylate, Compound 3 (2.0 g, 4.0 mmol) was dissolved in chloroform (30 ml). Thionyl chloride (1.2 ml, 16 mmol) was added followed by 5 drops of DMF. The reaction mixture was left at reflux temperature for one hour. A clear red solution was obtained. Excess of the thionyl chloride was removed together with chloroform by co-evaporation with toluene. To the solid residue, chloroform was added (30 ml) and 1.65 g of 2,2-diphenylethanol (8 mmol). The reaction mixture was left at reflux temperature for one hour. Work-up with water, drying (Na2SO4), and removing the solvent afforded a dark reddish brown solid (3.90 g) which was purified by column chromatography to give 600 mg of the product (17%).

500 mg (0.58 mmol) of the above, was dissolved in 20 ml of N-methylpyrrolidinone (NMP), flushed with argon, then CuCN (520 mg, 5.8 mmol) was added in one portion and left heated at 195° C. for 14 hours. After cooling, water was added (100 ml) to give a solid which was subjected to column chromatography (silica gel-Hex/EA-4:10) to arrive at Compound 4 (310 mg, 41%) as an orange-red solid.

The maximum absorption and fluorescence wavelength were measured in the form of both the chromophore solution and chromophore-doped film.

For example, in 0.5 wt % dichloromethane solution of the obtained chromophore (4,10-bis(4-(trifluoromethyl)phenyl) perylene-3,9-dicarboxylate), the maximum absorption of the chromophore was 471 nm and the maximum fluorescence absorption was 520 nm upon 470 nm light illumination. Also, in 0.5 wt % polymethylmethacrylate solution of the same chromophore, the maximum absorption of the chromophore was 480 nm and the maximum fluorescence absorption was 523 nm upon 470 nm light illumination. The wavelength differences between maximum absorption and maximum fluorescence is an improved property that is useful for new optical light collection systems and fluorescence-based solar collectors.

Example 3

Luminescent Medium

Preparation of a Organic Down-Shifting Luminescent Medium

The organic down-shifting luminescent medium, which comprises an optically transparent polymer matrix and at least one luminescent dye, was fabricated by (i) preparing a poly(methyl methacrylate) (PMMA) polymer solution by dissolving a PMMA powder (from Aldrich) in tetrachloroethylene (TCE) (from Aldrich) at a predetermined ratio of 20 wt %; (ii) preparing a luminescent dye containing a PMMA matrix by mixing the PMMA polymer solution with the synthesized diisobutyl 4,10-bis(4-(trifluoromethyl)phenyl) perylene-3,9-dicarboxylate ("Compound 2") at a weight ratio (Compound 2/PMMA) of about 0.5:99.5 to obtain a dye-containing polymer solution; (iii) forming the dye/polymer thin film by directly casting the dye-containing polymer solution onto a glass substrate, then heat treating the substrate from room temperature up to 100° C. in about 2 hours, then completely removing the remaining solvent by further vacuum heating at about 130° C. overnight; and (iv) peeling off the dye/polymer thin film under water and then drying out the free-standing polymer film before use in the experiments. The film thickness was about 250 μm, which was obtained by varying the dye/polymer solution concentration and evaporation speed.

Measurement of the Efficiency Enhancement

The solar cell photoelectric conversion efficiency was measured by a Newport 300 W full spectrum solar simulator system. The light intensity was adjusted to one sun (AM1.5G) by a 2×2 cm calibrated reference monocrystalline silicon solar cell. Then the I-V characterization of the CdS/CdTe solar cell was performed under the same irradiation and its efficiency is calculated by the Newport software program which is installed in the simulator. The CdS/CdTe solar cell used in this study has an efficiency $\eta_{cell}$ of 11.3%, which is similar to the efficiency level achieved in most commercially available CdS/CdTe cells. After determining the stand alone efficiency of the cell, the Compound 2/PMMA thin film organic down-shifting luminescent medium as manufactured above in Example 1, which was cut to the same shape and size of the light incident active window of the CdS/CdTe cell, was attached to the light incident front glass substrate of the CdS/CdTe cell as illustrated in FIG. 1, using a refractive index matching liquid (n=1.500) fill in between the luminescent film and the light incident glass surface of the CdS/CdTe solar cell. The solar cell efficiency with the luminescent film $\eta_{cell+luminescent\ film}$ was measured again under the same one sun exposure. The efficiency enhancement of the CdS/CdTe solar cell due to the attached luminescent film was determined using the following equation:

Efficiency Enhancement=$(\eta_{cell+luminescent\ film}-\eta_{cell})/\eta_{cell}*100\%$ Measurement of the Photostability The Compound 2/PMMA thin film organic down-shifting luminescent medium as manufactured above in Example 3, was encapsulated in a cylindrical metal container with two quartz windows. The operation was performed in a glove-box under inert gas purging. After ensuring the moisture and oxygen was completely removed from the sample container, the film was exposed to continuous one sun (AM1.5G) irradiation at ambient temperature. The absorption peak optical density (O.D.) of the luminescent film was monitored periodically by using a UV-Vis spectrometer. In an embodiment, easily degraded films typically show a drastic O.D. decay within a few days of one sun irradiation. In an embodiment, luminescent films with excellent photostability will maintain the peak O.D. over a long time period of exposure to one sun irradiation. In an embodiment, luminescent films are determined to be degraded when their O.D. drops below lie of the initial O.D. number.

Example 4

A thin film organic down-shifting luminescent medium was obtained in the same manner as in Example 3 except that the polymer matrix was polyvinyl butyral (PVB). The PVB powder was purchased from Aldrich.

Example 5

A thin film organic down-shifting luminescent medium was obtained in the same manner as in Example 3 except that the polymer matrix was ethylene vinyl acetate (EVA). The EVA powder was purchased from Aldrich.

Example 6

A thin film organic down-shifting luminescent medium was obtained in the same manner as in Example 3 except that the polymer matrix was PVB. The solar cell was a thin film CIGS cell with an efficiency $\eta_{cell}$ of 14.0%, which was higher than the efficiency level achieved in most commercially available CIGS cells.

Example 7

A thin film organic down-shifting luminescent medium was obtained in the same manner as in Example 3 except that the polymer matrix was EVA. The solar cell was a thin film CIGS cell with an efficiency $\eta_{cell}$ of 14.0%, which was higher than the efficiency level achieved in various commercial CIGS cells.

Comparative Example 1

A thin film organic down-shifting luminescent medium was obtained in the same manner as in Example 3 except that the luminescent dye was Rhodamine 6G, an ethyl O-(6-(ethylamino)-3-(ethylimino)-2,7-dimethyl-3H-xanthen-9-yl)benzoate monohydrochloride (purchased from Exciton) and the polymer matrix was PVB.

Comparative Example 2

A thin film organic down-shifting luminescent medium was obtained in the same manner as in Example 3 except that the luminescent dye was Lumogen Y083, a mixture of perylene dyes (purchased from BASF) and the polymer matrix was PVB.

Comparative Example 3

A thin film organic down-shifting luminescent medium was obtained in the same manner as in Example 3 except that the luminescent dye was Lumogen Y083, a mixture of perylene dyes (purchased from BASF).

TABLE 1

Efficiency enhancement and photostability of example luminescent films.

| Luminescent Medium | Polymer Matrix | Luminescent Dye | Solar cell | Efficiency Enhancement | Photostability (AM1.5G) |
|---|---|---|---|---|---|
| Example 3 | PMMA | Compound 2 | CdS/CdTe | 15% | >5000 hrs no degradation |
| Example 4 | PVB | Compound 2 | CdS/CdTe | 16% | >5000 hrs no degradation |
| Example 5 | EVA | Compound 2 | CdS/CdTe | 16% | N/A |
| Example 6 | PVB | Compound 2 | CIGS | 12% | >5000 hrs no degradation |
| Example 7 | EVA | Compound 2 | CIGS | 12% | N/A |
| Comparative Example 1 | PVB | Rhodamine 6G | CdS/CdTe | 3% | 150 hrs degraded |
| Comparative Example 2 | PVB | Y083 | CdS/CdTe | 8% | 400 hrs degraded |
| Comparative Example 3 | PMMA | Y083 | CdS/CdTe | 8% | 400 hrs degraded |

As illustrated in Table 1, the solar photoelectric conversion efficiency of CdS/CdTe and CIGS solar cells is greatly enhanced by applying the thin film organic down-shifting luminescent medium, as disclosed herein, to the solar cell. All prepared examples using the medium disclosed herein show an efficiency enhancement of greater than 12%, whereas the comparative examples, which utilize commercially available luminescent dyes, show only 3-8% efficiency enhancement. Additionally, the thin film organic down-shifting luminescent medium, as disclosed herein, shows surprisingly good photostability in comparison with the relatively short lifetime of the luminescent films fabricated with commercial dyes. All prepared examples using the medium disclosed herein remained stable for greater than 5000 hours, whereas the mediums prepared using the commercially available dyes degraded within 400 hours or less. It is believed, to the best of the authors knowledge, that the thin film organic down-shifting luminescent medium, as disclosed herein, when applied to the CdS/CdTe or CIGS solar cell, shows significantly enhanced photoelectric conversion efficiency and significantly longer photostability than any other wavelength down-shifting medium previously reported.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A perylene diester derivative represented by the following general formula (I) or general formula (II):

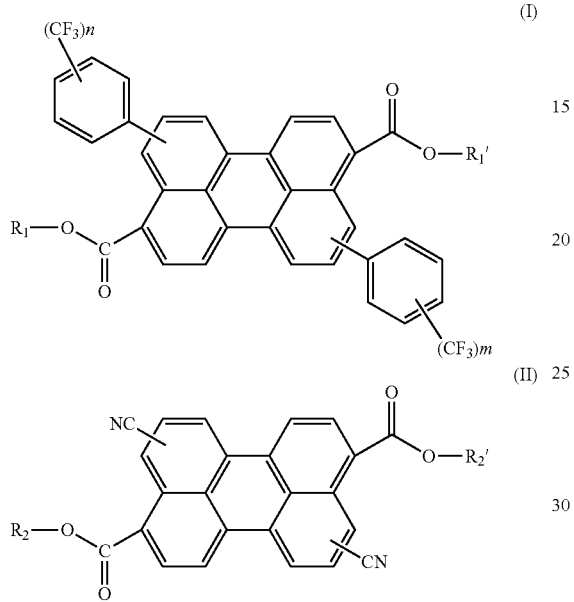

wherein $R_1$ and $R_1'$ in formula (I) are each independently selected from the group consisting of hydrogen, $C_1$-$C_{10}$ alkyl, $C_3$-$C_{10}$ cycloalkyl, $C_2$-$C_{10}$ alkoxyalkyl, $C_6$-$C_{18}$ aryl, and $C_6$-$C_{20}$ aralkyl; m and n in formula (I) are each independently in the range of from 1 to 5; and $R_2$ and $R_2'$ in formula (II) are each independently selected from the group consisting of a $C_6$-$C_{18}$ aryl and $C_6$-$C_{20}$ aralkyl.

2. The perylene diester derivative of claim 1, wherein $R_1$ and $R_1'$ are independently selected from the group consisting of hydrogen, $C_1$-$C_6$ alkyl, $C_2$-$C_6$ alkoxyalkyl, and $C_6$-$C_{18}$ aryl.

3. The perylene diester derivative of claim 1, wherein $R_1$ and $R_1'$ are each independently selected from the group consisting of isopropyl, isobutyl, isohexyl, isooctyl, 2-ethylhexyl, diphenylmethyl, trityl, and diphenyl.

4. The perylene diester derivative of claim 1, wherein $R_2$ and $R_2'$ are each independently selected from the group consisting of diphenylmethyl, trityl, and diphenyl.

5. An organic down-shifting luminescent medium comprising an optically transparent polymer matrix and at least one luminescent dye;
wherein the organic down-shifting luminescent medium receives as input at least one photon having a first wavelength, and provides as output at least one photon having a second wavelength, wherein the second wavelength is longer than the first wavelength;
wherein the luminescent dye comprises the perylene diester derivative of claims 1.

6. The organic down-shifting luminescent medium of claim 5, wherein the polymer matrix comprises a polymer selected from the group consisting of polymethyl methacrylate, polyvinyl butyral, ethylene vinyl acetate, ethylene tetrafluoroethylene, polyimide, amorphous polycarbonate, polystyrene, siloxane sol-gel, polyurethane, polyacrylate, and combinations thereof.

7. The organic down-shifting luminescent medium of claim 5, wherein the refractive index of the polymer matrix is in the range of about 1.400 to about 1.700.

8. The organic down-shifting luminescent medium of claim 5, wherein the luminescent dye is present in the polymer matrix in an amount in the range of about 0.01 wt % to about 3.0 wt %.

9. A photovoltaic module for the conversion of solar light energy into electricity, comprising at least one photovoltaic device or solar cell, and an organic down-shifting luminescent medium according to claims 5;
wherein the at least one photovoltaic device or solar cell is adapted to convert incident solar light energy into electricity;
wherein the at least one photovoltaic device or solar cell comprises a light incident surface substrate; and
wherein the organic down-shifting luminescent medium is incorporated on top of, or into, the photovoltaic device or solar cell, such that the incident light passes through the organic down-shifting luminescent medium prior to reaching an area of the photovoltaic module where solar light energy is converted into electricity.

10. The photovoltaic module of claim 9, wherein the organic down-shifting luminescent medium is in the form of a film having a thickness in the range of about 0.1 µm to about 1 mm.

11. The photovoltaic module of claim 9, wherein the organic down-shifting luminescent medium is in the form of a film with a thickness in the range of about 0.5 µm to about 0.5 mm.

12. The photovoltaic module of claim 9, wherein the photovoltaic device or solar cell comprises a Cadmium Sulfide/Cadmium Telluride solar cell or a Copper Indium Gallium Diselenide solar cell.

13. The photovoltaic module of claim 9, further comprising a refractive index matching liquid or optical adhesive that is used to attach the organic down-shifting luminescent medium to the light incident surface substrate of the photovoltaic device or solar cell.

14. A method for improving the performance of a photovoltaic device or a solar cell, comprising:
applying an organic down-shifting luminescent medium according to claim 5 directly onto the light incident side of the photovoltaic device or solar cell.

15. The method of claim 14, wherein the organic down-shifting luminescent medium is applied as a film with a thickness in the range of about 0.1 µm to about 1 mm.

16. The method of claim 14, wherein the photovoltaic device or solar cell device comprises a Cadmium Sulfide/Cadmium Telluride solar cell or a Copper Indium Gallium Diselenide solar cell.

17. The method of claim 14, further comprising applying a refractive index matching liquid or optical adhesive to the organic down-shifting luminescent medium or the light incident surface substrate of the photovoltaic device or solar cell.

18. A method for improving the performance of a photovoltaic device or solar cell, comprising:
incorporating an organic down-shifting luminescent medium according to claim 5 directly into the photovoltaic device or solar cell during its fabrication, such that the organic down-shifting luminescent medium is between the photovoltaic device or solar cell and a cover substrate on the light incident side.

19. The method of claim 18, wherein the organic down-shifting luminescent medium is a film with a thickness in the range of about 0.1 μm to about 1 mm.

20. The method of claim 18, wherein the photovoltaic device or solar cell device comprises a Cadmium Sulfide/Cadmium Telluride solar cell or a Copper Indium Gallium Diselenide solar cell.

* * * * *